US010373995B2

(12) United States Patent
Guenter

(10) Patent No.: US 10,373,995 B2
(45) Date of Patent: Aug. 6, 2019

(54) IMAGE SENSOR BENDING USING TENSION

(71) Applicant: Microsoft Technology Licensing, LLC, Redmond, WA (US)

(72) Inventor: Brian K. Guenter, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 285 days.

(21) Appl. No.: 14/491,928

(22) Filed: Sep. 19, 2014

(65) Prior Publication Data

US 2016/0086994 A1 Mar. 24, 2016

(51) Int. Cl.
*H01L 27/146* (2006.01)
*H04N 5/369* (2011.01)

(52) U.S. Cl.
CPC .. *H01L 27/14625* (2013.01); *H01L 27/14607* (2013.01); *H01L 27/14618* (2013.01); *H01L 27/14683* (2013.01); *H04N 5/3696* (2013.01); *H01L 27/14643* (2013.01)

(58) Field of Classification Search
CPC ......... H01L 27/14625; H01L 27/14607; H01L 27/14618; H01L 27/14683; H01L 27/14643; H04N 5/3696
USPC ........................................ 250/206
See application file for complete search history.

(56) References Cited

U.S. PATENT DOCUMENTS

| 5,349,443 A | 9/1994 | Guerra |
| 5,514,888 A | 5/1996 | Sano et al. |
| 5,554,570 A | 9/1996 | Maeda et al. |
| 6,255,025 B1 | 7/2001 | Akutsu et al. |
| 6,285,400 B1 * | 9/2001 | Hokari .................. H04N 5/217 250/239 |
| 6,312,959 B1 | 11/2001 | Datskos |
| 6,451,670 B1 | 9/2002 | Takisawa et al. |
| 6,706,448 B1 | 3/2004 | Gole et al. |

(Continued)

FOREIGN PATENT DOCUMENTS

| CN | 102479794 A | 5/2012 |
| CN | 102651382 A | 8/2012 |

(Continued)

OTHER PUBLICATIONS

Office action for U.S. Appl. No. 14/677,622, dated Jun. 2, 2016, Keefe et al., "Bending Semiconductor Chip in Molds Having Radially Varying Curvature", 8 pages.

(Continued)

*Primary Examiner* — John R Lee
(74) *Attorney, Agent, or Firm* — Drinker Biddle & Reath LLP

(57) ABSTRACT

Techniques for fabricating an image sensor chip having a curved surface include placing a bending substrate on a first surface of an imaging sensor chip. The first surface of the imaging sensor chip includes light sensors to generate electrical signals in response to receiving light. Fabricating also includes bending the bending substrate so as to impart forces on the image sensor chip to produce a curved imaging sensor chip. A second surface of the curved imaging sensor chip may be adhered to a backside substrate. The second surface is opposite the first surface. The bending substrate may be removed from the first surface of the imaging sensor chip.

20 Claims, 8 Drawing Sheets

(56) References Cited

U.S. PATENT DOCUMENTS

| | | | |
|---|---|---|---|
| 6,762,510 B2* | 7/2004 | Fock | H01L 23/49855 257/787 |
| 6,791,072 B1 | 9/2004 | Prabhu | |
| 7,190,039 B2 | 3/2007 | Boettiger et al. | |
| 7,397,066 B2 | 7/2008 | Oliver | |
| 7,507,944 B1 | 3/2009 | Arnzen et al. | |
| 7,626,621 B2 | 12/2009 | Ito et al. | |
| 7,696,588 B2 | 4/2010 | Boettiger et al. | |
| 7,714,437 B2 | 5/2010 | Naya | |
| 7,733,397 B2 | 6/2010 | Lu et al. | |
| 7,742,090 B2 | 6/2010 | Street et al. | |
| 7,923,793 B2 | 4/2011 | Choi et al. | |
| 8,124,519 B2 | 2/2012 | Bone | |
| 8,248,499 B2 | 8/2012 | Sutton et al. | |
| 8,654,215 B2 | 2/2014 | Sutton et al. | |
| 8,810,671 B2 | 8/2014 | Winter | |
| 8,836,805 B2 | 9/2014 | Sutton et al. | |
| 8,878,116 B2 | 11/2014 | Itonaga | |
| 9,490,285 B2 | 11/2016 | Itonaga | |
| 9,551,856 B2 | 1/2017 | Gabriel et al. | |
| 9,570,488 B2 | 2/2017 | McKnight et al. | |
| 9,859,314 B2 | 1/2018 | McKnight et al. | |
| 9,870,927 B2 | 1/2018 | Keefe et al. | |
| 2001/0020671 A1 | 9/2001 | Ansorge et al. | |
| 2003/0013280 A1 | 1/2003 | Yamanaka | |
| 2004/0133275 A1 | 7/2004 | Mansmann | |
| 2004/0229071 A1 | 11/2004 | Jankosky et al. | |
| 2005/0030408 A1 | 2/2005 | Ito et al. | |
| 2005/0035514 A1 | 2/2005 | Hillman et al. | |
| 2006/0186492 A1 | 8/2006 | Boettiger et al. | |
| 2006/0275941 A1 | 12/2006 | Oliver et al. | |
| 2007/0096235 A1 | 5/2007 | Boettiger et al. | |
| 2007/0222013 A1 | 9/2007 | Lincoln et al. | |
| 2008/0105455 A1* | 5/2008 | Palfreyman | H05K 1/0271 174/254 |
| 2008/0237443 A1 | 10/2008 | Oliver et al. | |
| 2009/0045510 A1 | 2/2009 | Naya | |
| 2009/0115875 A1 | 5/2009 | Choi et al. | |
| 2009/0184954 A1 | 7/2009 | Street | |
| 2010/0025789 A1 | 2/2010 | Imai et al. | |
| 2010/0178722 A1* | 7/2010 | de Graff | H01L 27/14618 438/65 |
| 2011/0057284 A1 | 3/2011 | Brodie | |
| 2011/0163466 A1 | 7/2011 | Taguchi et al. | |
| 2011/0200883 A1 | 8/2011 | Cui et al. | |
| 2012/0002087 A1 | 1/2012 | Kim | |
| 2012/0147207 A1 | 6/2012 | Itonaga | |
| 2012/0159996 A1 | 6/2012 | Sutton | |
| 2012/0217606 A1* | 8/2012 | Itonaga | H01L 31/0203 257/443 |
| 2012/0261551 A1 | 10/2012 | Rogers | |
| 2012/0299140 A1 | 11/2012 | Sekine | |
| 2013/0268490 A1 | 10/2013 | Keebler et al. | |
| 2013/0270662 A1 | 10/2013 | Roy et al. | |
| 2013/0312541 A1 | 11/2013 | Majidi et al. | |
| 2014/0004644 A1 | 1/2014 | Roy et al. | |
| 2014/0049683 A1 | 2/2014 | Guenter et al. | |
| 2014/0063794 A1* | 3/2014 | Parekh | F21S 8/04 362/185 |
| 2014/0160327 A1* | 6/2014 | Enoki | H01L 27/307 348/294 |
| 2014/0303452 A1 | 10/2014 | Ghaffari | |
| 2015/0194585 A1* | 7/2015 | Kim | H01L 33/62 257/99 |
| 2015/0334300 A1 | 11/2015 | Gabriel et al. | |
| 2016/0086987 A1 | 3/2016 | McKnight et al. | |
| 2016/0086994 A1 | 3/2016 | Guenter | |
| 2016/0240582 A1* | 8/2016 | Yamamoto | H01L 27/14627 |
| 2016/0268327 A1 | 9/2016 | Lin et al. | |
| 2016/0286102 A1 | 9/2016 | Sulfridge et al. | |
| 2017/0117311 A1 | 4/2017 | McKnight et al. | |
| 2018/0076257 A1 | 3/2018 | Mcknight et al. | |
| 2018/0076336 A1 | 3/2018 | De graff et al. | |

FOREIGN PATENT DOCUMENTS

| | | |
|---|---|---|
| CN | 202549843 U | 11/2012 |
| EP | 1132967 | 9/2001 |
| EP | 2458638 A1 | 5/2012 |
| JP | 2012182194 A | 9/2012 |
| JP | 2012249003 A | 12/2012 |
| KR | 1020090044901 A | 5/2009 |

OTHER PUBLICATIONS

Office Action for U.S. Appl. No. 14/677,697, dated Jun. 30, 2016, Keefe et al., "Free-Edge Semiconductor Chip Bending", 9 pages.

The PCT Search Report and Written Opinion dated Jul. 1, 2016 for PCT Application No. PCT/US16/025453, 10 Pages.

The PCT Search Report and Written Opinion dated Jul. 4, 2016 for PCT Applicatoin No. PCT/US16/025454, 11 pages.

The PCT Written Opinion of the International Preliminary Examining Authority dated Aug. 4, 2016 for PCT application No. PCT/US2015/049276, 7 pages.

Office action for U.S. Appl. No. 14/491,903, dated Feb. 17, 2016, McKnight et al., "Image Sensor Bending by Induced Substrate Swelling", 10 pages.

Cherng et al., "Fabrication of polydimethylsiloxane microlens array on spherical surface using multi-replication process", in the Journal of Micromechanics and Microengineering, vol. 24, No. 1 2014, 10 pages.

PCT Search Report & Written Opinion for Application No. PCT/US2015/049276, dated Dec. 10, 2015, 13 pages.

Itonaga, "A Novel Curved CMOS Image Sensor Integrated with Imaging System", in the Proceedings of the Symposium on VLSI Technology (VLSI-Technology): Digest of Technical Papers, Jun. 19, 2014, 2 pages.

Iwert et al., "First results from a novel curving process for large area scientific imagers", In the Journal of International Society of Optics and Photonics, SPIE Astronomical Telescopes+, 2012, 14 pages.

"Sony Unveils Curved Sensor-Technology" retrieved on Jan. 23, 2015 at <<http://petapixel.com/2014/04/02/sony-unveils-curved-senor-technology/>>, 8 pages.

Tekaya et al, "Mechanical Behavior of Flexible Silicon Devices Curved in Spherical Configurations", in the Proceedings of the 14th International Conference on Thermal, Mechanical and Multi-Physics Simulation and Experiments in Microelectronics and Microsystems, Apr. 14, 2013, 7 pages.

Clarke, Peter "Sony Curves Images Sensors & TSMC Stacks Them", retrieved on Jul. 30, 2014, available at <<http://www.eetimes.com/document.asp?doc_id=1321841>>, EE Times, Apr. 9, 2014, 2 pages.

Guvendiren et al., "Swelling-Induced Surface Patterns in Hydrogels with Gradient Crosslinking Density", In the Journal of Advanced Functional Materials, vol. 19, Iss. 19, Oct. 9, 2009, 9 pages.

Mokwa et al., "CMOS Transistors under Uniaxial Stress on Ultra-Thin Chips for Appications in Bendable Image Sensors", In the Proceedings of the 2012 8th Conference on Ph.D. Research in Microelectronics and Electronics (PRIME), Jun. 12, 2012, 4 pages.

Office action for U.S. Appl. No. 14/491,903, dated May 5, 2016, McKnight et al., "Image Sensor Bending by Induced Substrate Swelling", 12 pages.

International Search Report & Written Opinion Received for PCT Application No. PCT/US2015/049277, dated Nov. 26, 2015, 10 Pages.

Mokwa et al., "CMOS Transistors under Uniaxial Stress on Ultra-Thin Chips for Applications in Bendable Image Sensors", In the Proceedings of the 2012 8th Conference on Ph.D. Research in Microelectronics and Electronics (PRIME), Jun. 12, 2012, 4 pages.

Office Action for U.S. Appl. No. 14/491,928, dated Oct. 5,2016, Guenter, "Image Sensor Bending Using Tension", 13 pages.

Office action for U.S. Appl. No. 14/677,622, dated Nov. 2, 2016, Keefe et al., "Bending Semiconductor Chip in Molds Having Radially Varying Curvature", 12 pages.

Office Action for U.S. Appl. No. 14/677,697, dated Dec. 28, 2016, Keefe et al., "Free-Edge Semiconductor Chip Bending", 11 pages.

Rehm, "Apple patent describes use of curved image sensor to design

(56) References Cited

OTHER PUBLICATIONS small camera module", available at: <<https://www.dpreview.com/articles/8027168176/apple-patent-describes-use-of-curved-image-sensor-to-design-small-camera-module>>, Jan. 28, 2016, 7 pages.
Sanyal, "Sony's curved sensors may allow for simpler lenses and better images", available at: <<https://www.dpreview.com/articles/2279255612/sony-s-curved-sensors-may-allow-for-simpler-lenses-and-better-images>>, Jun. 18, 2014, 20 pages.
Shao et al., "Synthesis Surface Effects on the Stress and Deformation of Film/Substrate System", in the Journal of Applied Surface Science, vol. 257, Iss. 23, Sep. 15, 2011, 6 pages.
Office action for U.S. Appl. No. 14/677,622, dated Feb. 3, 2017, Keefe et al., "Bending Semiconductor Chip in Molds Having Radially Varying Curvature", 15 pages.
"Notice of Allowance Issued in U.S. Appl. No. 14/491,903", dated Sep. 28, 2016, 8 Pages. (MS# 355555-US-NP).
"Final Office Action Issued in U.S. Appl. No. 14/677,622", dated Jul. 20, 2017, 13 Pages. (MS# 356525-US-NP).
"Non Final Office Action Issued in U.S. Appl. No. 15/398,266", dated Jun. 12, 2017, 16 Pages. (MS# 355555-US-DIV).
"International Preliminary Report on Patentability Issued in PCT Application No. PCT/US2015/049276", dated Nov. 22, 2016, 9 Pages. (MS# 355530-WO-PCT).
"International Preliminary Report on Patentability Issued in PCT Application No. PCT/US2016/025454", dated Mar. 20, 2017, 7 Pages. (MS# 356550-WO-PCT).
"Notice of Allowance Issued in U.S. Appl. No. 14/677,697", dated Jun. 7, 2017, 7 Pages. (MS# 356550-US-NP).
"Final Office Action Issued in U.S. Appl. No. 14/491,928", dated Jun. 11, 2018, 21 Pages.
"Non Final Office Action Issued in U.S. Appl. No. 14/491,928", dated Nov. 2, 2017, 13 Pages.
"Non Final Office Action Issued in U.S. Appl. No. 15/393,187", dated Mar. 27, 2018, 9 Pages.
"Office Action Issued in European Patent Application No. 15770997.3", dated May 2, 2018, 4 Pages.
"Office Action Issued in Chilean Patent Application No. 648-2017", dated May 23, 2018, 9 Pages.
"Non Final Office Action Issued in U.S. Appl. No. 14/677,622", dated Nov. 16, 2017, 17 Pages.
"Office Action and Search Report Issued in European Patent Application No. 16718755.8", dated Oct. 10, 2018, 3 Pages. (MS# 356525-EP-EPT).
"Office Action Issued in Israeli Patent Application No. 250482", dated Sep. 2, 2018, 21 Pages. (MS# 355555-IL-PCT) (w/o english translation).
"Office Action Issued in Chilean Patent Application No. 6482017", dated Sep. 27, 2018, 7 Pages. (MS# 355555-CL-PCT).
"Oral Hearings Issued in European Patent Application No. 15770997.3", dated Dec. 10, 2018, 5 Pages (MS# 355530-EP-EPT).
"Office Action Issued in Australian Patent Application No. 2015318205", dated Jan. 9, 2019, 3 Pages. (MS# 355530-AU-PCT).
"Office Action Issued in Colombian Patent Application No. NC2017/0002554", dated Dec. 11, 2018, 9 Pages. (MS# 355555-CO-PCT) (w/o english translation).
"First Office Action & Search Report Issued in Chinese Patent Application No. 201580050443.4", dated Feb. 28, 2019, 14 Pages.
"Office Action Issued in Russian Patent Application No. 2017108537", dated Mar. 19, 2019, 17 Pages.

\* cited by examiner

IMAGE SENSOR BENDING USING TENSION

BACKGROUND

Optical systems are commonly used in many devices, such as cameras, telescopes, binoculars, office equipment, and scientific instruments, just to name a few examples. Optical systems may comprise lenses, mirrors, and/or one or more light sensing devices. Performance of optical systems hinges, in part, on the design of each of the elements of the system as well as the overall design of the system, which sets forth the optical interaction among the elements. For example, light output of one lens may be the light input of a subsequent lens or a light sensing device.

Light sensing devices, such as charge-coupled devices (CCDs) or photodiodes, are present in a variety of optical systems. Often, CCDs are configured in an array fabricated on a silicon substrate. A portion of an optical system that provides light to a CCD array may be designed based, at least in part, on particular details of the CCD array, such as the size of the CCD array, the resolution of the CCD array, and the positioning of the CCD array with respect to the remainder of the optical system.

SUMMARY

This disclosure describes techniques and architectures for bending and shaping image sensors. In particular, an image sensor fabricated on a relatively brittle substrate, such as silicon or germanium, for example, may be bent so that the light-sensitive surface of the image sensor is curved to have a spherical, aspheric, or other shape.

To bend an image sensor, a bending substrate may be bonded or deposited onto the light-sensitive surface of the image sensor. Forces or torques are applied to the bending substrate so as to introduce tension to the image sensor. The tension leads to bending of the image sensor into any of a number of curved shapes. The forces or torques may be applied relatively uniform or non-uniform depending on the curved shape desired.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The term "techniques," for instance, may refer to fabricating equipment, control system(s), method(s), computer-readable instructions, module(s), algorithms, or hardware logic (e.g., Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs)), which may be used to perform the technique(s) as permitted by the context above and throughout the document.

BRIEF DESCRIPTION OF THE DRAWINGS

The detailed description is set forth with reference to the accompanying figures. In the figures, the left-most digit of a reference number identifies the figure in which the reference number first appears. The use of the same reference numbers in different figures indicates similar or identical items or features.

DETAILED DESCRIPTION

Overview

Figure 1:
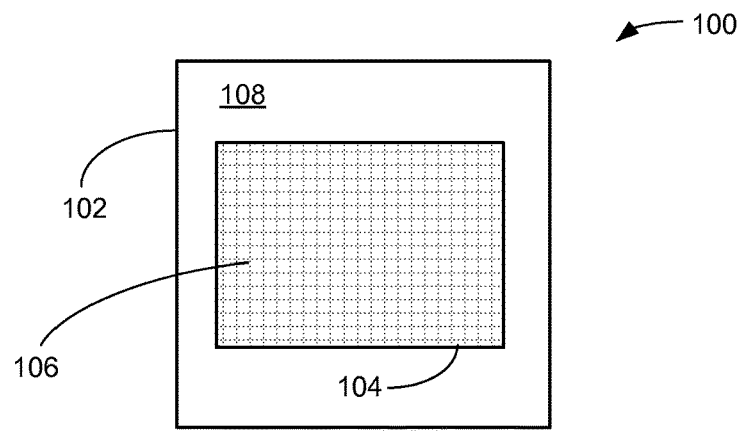
FIG. 1 is a top view of an image sensor chip, according to various example embodiments.

Generally, optical systems may comprise lenses, mirrors, and/or one or more light sensing devices, such as charge-coupled device (CCDs) or other devices that can convert light energy into electrical signals. A plurality of CCDs may be configured in an array (e.g. a pixelated array) fabricated on a substrate, which may be silicon, germanium, or other semiconductor material, for example. A light-sensitive device, such as an array of CCDs or other light sensing entity in any of a number of configurations, fabricated on a substrate is herein called an "image sensor chip". It should be noted, however, that this name may refer to a light sensor that need not be configured to sense an image, but rather any light signal (visible or not).

An image sensor chip may be bent so that the light-sensitive surface of the image sensor chip has a curved shape, which may provide a number of advantages to the design of an optical system, as compared to a flat-surface image sensor chip. In particular, optical systems comprising lenses and/or mirrors have fewer design constraints when the optical systems include a curved image sensor chip, as compared to a flat-surface image sensor chip. For example, an image sensor chip having a spherical or aspheric surface may lead to a high performance optical system that produces a relatively uniform light intensity and spatial frequency response across the surface of the image sensor chip.

In various embodiments, an image sensor chip may be bent in a process that includes bonding or depositing a "bending substrate" onto the light-sensitive surface of the image sensor chip. Forces or torques are applied to the bending substrate so as to apply shear forces to the image sensor chip. This introduces relatively uniform tension across the surface of the chip. Such uniformity helps avoid undesirable cracking or buckling of the relatively brittle image sensor chip. The tension leads to bending of the image sensor chip into a curved shape. In some embodiments, non-uniform tension can be selectively introduced without undesirable cracking or buckling.

In addition, the bending substrate may deform or bend the image sensor chip by tension. Because the image sensor chip may have a lower dark current when in tension, as compared to being in a compressed state, bending the image sensor chip using tension may be beneficial. Accordingly, the bending substrate may be designed so that a substantial portion of the area of the image sensor chip is in tension while being bent or deformed into a desired shape. Such a design may be based, at least in part, on stiffness and/or thickness of the bending substrate so as to place the image sensor chip on the tension side of a neutral bending axis.

In various embodiments, the curved image sensor chip is bonded to a backside substrate that helps to maintain the curved shape of the image sensor chip. Subsequent to bonding the image sensor chip to the backside substrate, the bending substrate may be removed (e.g., to expose the light-sensitive surface of the image sensor chip).

In various embodiments, the combination of a curved image sensor chip bonded to a bending substrate may comprise a stand-alone optical device that may be subsequently incorporated into optical systems. In some implementations, such a combination may include a backside substrate attached to the backside (e.g., the side opposite the light-sensitive surface) of the image sensor chip. For example, a manufacturer may fabricate an optical device comprising the combination of a curved image sensor chip bonded to a bending substrate (and to a backside substrate, in some cases). The manufacturer may supply such an optical device to another manufacturer that produces optical systems. The optical device may be incorporated into such optical systems. In some implementations, the manufacturer producing the optical systems may remove the bending substrate, which may act to protect the light-sensitive surface from damage during storage or shipping, from the image sensor chip.

In various embodiments, the combination of a curved image sensor chip bonded to a backside substrate may comprise a stand-alone optical device that may be subsequently incorporated into optical systems. For example, a manufacturer may fabricate an optical device comprising the combination of a curved image sensor chip bonded to a backside substrate. The manufacturer may supply such an optical device to another manufacturer that produces optical systems. The optical device may be incorporated into such optical systems.

Various example embodiments are described further with reference to FIGS. 1-20.

Example Environment

FIG. 1 is a top view of an image sensor chip 100, according to various embodiments. Image sensor chip 100 includes a semiconductor substrate 102 upon which a light-sensitive portion 104 is built. Light-sensitive portion 104, which may be a CCD array, includes a plurality of light-sensitive elements 106. Each such light-sensitive element 106, for example, may correspond to a pixel of an image produced, in part, by light-sensitive portion 104. Light-sensitive portion 104 may be referred to as an "active region", which is capable of converting light energy to electrical energy or electrical signals. Unless otherwise noted, the term "light" refers to electromagnetic energy in any portion of the spectrum. Thus, for example, light or light energy encompasses visible, infrared (IR), near-infrared (NIR), and ultraviolet (UV) portions of the electromagnetic spectrum.

An inactive region 108 at least partially surrounds light-sensitive portion 104. Inactive region 108, void of light-sensitive elements, may include various circuit elements, conductive traces, and so on for operating light-sensitive portion 104. For example, if light-sensitive portion 104 is a CCD array, inactive region 108 may include circuitry for controlling rows and columns of the CCD elements. Each of light-sensitive portion 104 and inactive region 108 may occupy any portion of the area of image sensor chip 100. Light-sensitive portion 104 may be square or rectangular having any aspect ratio (e.g., width-to-height).

Semiconductor substrate 102 may comprise any number of elements, including combinations of such elements, any of which may include added impurities (e.g., dopants). For example, semiconductor substrate 102 may be silicon or germanium. In some examples, thickness of image sensor chip 100 may range from about 5 to 10 microns up to about a millimeter.

Image sensor chip 100 may be incorporated into an optical system that provides light in a particular fashion to image sensor chip 100. For example, in some implementations, a lens system may be configured to have a focal plane that coincides with the location of image sensor chip 100. In a particular implementation, a lens system may be configured to have a focal surface that coincides with the curved surface of a curved version of image sensor chip 100. In other implementations, a lens system may be configured to have a focal length that coincides with the focal length of image sensor chip 100. Optical elements (e.g., lenses and/or mirrors) of the optical system may at least partially determine the location of a focal plane and a focal length. In particular, a portion of an optical system that provides light to light-sensitive portion 104 may be designed based, at least in part, on particular details of light-sensitive portion 104, such as the size of light-sensitive portion 104, the resolution of light-sensitive portion 104, and the positioning of light-sensitive portion 104 with respect to the remainder of the optical system. Performance of optical systems hinges on the design of each of the optical elements of the optical system as well as the overall design of the optical system, which sets forth the optical interaction among the optical elements. For example, light output of one lens may be the light input of a subsequent lens. Generally, quality of the optical elements and their arrangement with respect to one another increases as resolution (e.g., density of light-sensitive elements 106, such as CCD elements that correspond to pixels) increases. For example, such quality may be based, at least in part, on parameters of the individual optical elements, including, but not limited to, structural and optical aberrations, optical transmission or reflection, light uniformity, positioning, and so on.

FIGS. 2-6 illustrate various portions of an example process of bending or shaping an image sensor chip, such as image sensor chip 100, according to some embodiments. Such a process may be performed by any entity, either manually (e.g., by human), automatically (e.g., by machine), or a combination thereof. Such an entity, which may, for example, be a manufacturer, assembler, fabricator, or builder is herein referred to as a "fabricator".

Figure 2:
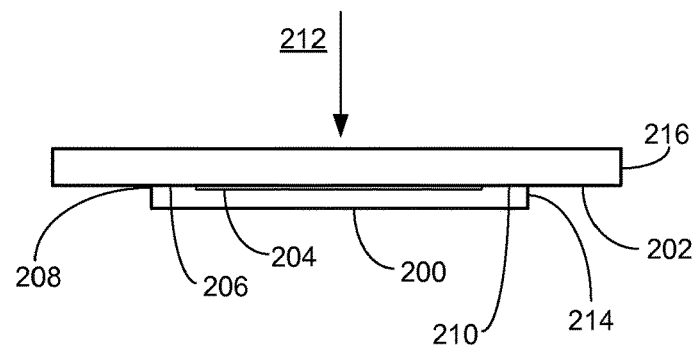
FIG. 2 is a side view of an image sensor chip and a bending substrate, according to various example embodiments.

FIG. 2 is a side view of an image sensor chip 200 and a bending substrate 202, according to various embodiments. Image sensor chip 200 includes a light-sensitive portion 204, which may be the same as or similar to light-sensitive portion 104 illustrated in FIG. 1, for example. In some implementations, bending substrate 202 is bonded or laminated to a first surface 206 of image sensor chip 200. A fabricator may use an adhesive 208 to perform such bonding or laminating. In some implementations, however, an adhesive need not be used. In various implementations, portions of first surface 206 need not be bonded or glued to bending substrate 202. For example, particular areas of first surface 206 may be bonded or glued to bending substrate 202 while other particular areas of first surface 206 may either i) include a void (not shown) between bending substrate 202 and first surface 206 or ii) lack adhesive 208 between bending substrate 202 and first surface 206. A fabricator may at least partially control transfer of tension (and thus shaping) from bending substrate 202 to image sensor chip 200 by including particular areas of first surface 206 that either have a void or lack an adhesive, for example.

First surface 206 includes light-sensitive portion 204, which is the light-sensitive portion of image sensor chip 200. First surface 206 may also include an inactive region 210, which may be the same as or similar to inactive region 108 illustrated in FIG. 1, for example. Arrow 212 indicates a direction of incident light which image sensor chip 200 is configured to receive.

An edge 214 of image sensor chip 200 may or may not align with an edge 216 of bending substrate 202. In some implementations, as illustrated in FIG. 2, bending substrate 202 may extend beyond edge 214 of image sensor chip 200. In other implementations, image sensor chip 200 may extend beyond edge 216 of bending substrate 202.

Bending substrate 202 may comprise any of a number of materials, such as, for example, plastics, polymers, other organic compounds, combinations thereof, or the like. In some examples, a thickness of bending substrate 202 may be at least several times greater than a thickness of image sensor chip 200. For a particular example, image sensor chip 200 may be about 5 to 10 microns thick and bending substrate 202 may be about 50 to 100 microns thick. The thickness of image sensor chip 200 may be much greater than 10 microns, and bending substrate 202 may be at least several times thicker than image sensor chip 200. In some implementations, different portions of bending substrate 202 may have different thicknesses. Selection of material for bending substrate 202 may be based, at least in part, on stiffness of the material as compared to the stiffness of image sensor chip 200. The stiffness of image sensor chip 200 may depend, at least in part, on the substrate material of image sensor chip 200, which may be silicon or germanium, and thickness of the image sensor chip 200. The stiffness of bending substrate 202 may depend, at least in part, the material and thickness used for bending substrate 202. In some implementations, the material and thickness used for bending substrate 202 may be different for different portions of bending substrate 202. Accordingly, stiffness of bending substrate 202 may vary over different portions of image sensor chip 200. For example, a portion of bending substrate 202 that is over a central region of image sensor chip 200 may be relatively stiff compared to portions of bending substrate 202 that are over edge regions of image sensor chip 200.

Selection of material for bending substrate 202 may be based, at least in part, on thermal properties of the material. For example, the selected material can be applied to image sensor chip 200 at temperatures substantially below where damage to image sensor chip 200 may occur. Excessive temperatures may damage light-sensitive portion 204, the semiconductor substrate, and/or the inactive region of image sensor chip 200. For example, in the case of silicon-based image sensor chips, temperatures below about 200 degrees centigrade may be safe and not damage image sensor chip 200. Similarly, such temperature considerations may apply to a process for removing the material used for bending substrate 202 from image sensor chip 200.

In addition to temperature considerations, selection of material for bending substrate 202 may be based, at least in part, on ability to apply the material to image sensor chip 200 and to subsequently remove the material from image sensor chip 200. For example, a material may be selected so that it is relatively easy to laminate or glue the material to image sensor chip 200, and that it releases from image sensor chip 200 without leaving any residual material and/or without changing any physical characteristics of light-sensitive portion 204.

Figure 3:
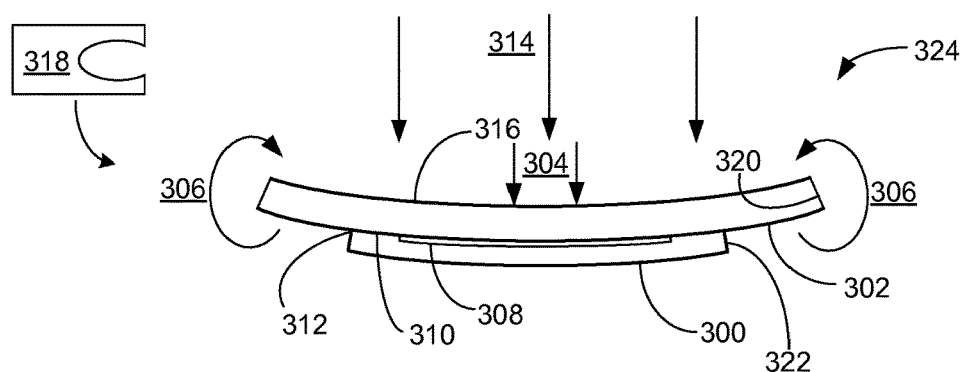
FIG. 3 is a side view of a curved image sensor chip and a bending substrate subjected to applied forces and torques, according to various example embodiments.

FIG. 3 is a side view of a curved image sensor chip 300 and a bending substrate 302 subjected to various applied forces and torques, according to some embodiments. In some examples, curved image sensor chip 300 and bending substrate 302 may be the same as or similar to image sensor chip 200 and bending substrate 202, respectively, prior to the bending illustrated in FIG. 3. For example, a fabricator may apply forces 304 and/or torques 306 to bending substrate 202 to introduce tension that results in deforming image sensor chip 100 to produce curved image sensor chip 300. Such forces and/or torques applied to a bending substrate and/or image sensor chip may give rise to reaction forces, which may be located at points of contact where a structure (not shown) supports or holds the bending substrate and image sensor chip. For example, a force pushing down on an object on a table will give rise to a reaction force of the table pushing up on the object. For sake of clarity in the figures, reaction forces are not illustrated herein.

Curved image sensor chip 300 includes a curved light-sensitive portion 308 disposed on a curved first surface 310. An adhesive 312, which may be the same as or similar to adhesive 208, may bond curved image sensor chip 300 and bending substrate 302 together.

A fabricator may apply any of a number of types of forces to bending substrate 302 to bend image sensor chip 300. For example, a pressurized fluid or gas 314 adjacent to bending substrate 302 may impart forces 304 on bending substrate 302. In some implementations, pressurized fluid or gas 314, indicated by arrows in FIG. 3, may comprise a contained fluid or gas (e.g., contained in a flexible bladder or mechanical actuator) adjacent to at least a portion of surface 316 of bending substrate 302. Pressurized fluid or gas 314 may impart different forces 304 at different locations on surface 316. In some cases, mechanical contact by a solid object (not shown) having any of a number of shapes may replace pressurized fluid or gas 314 and impart forces 304.

In other implementation, a fabricator may apply one or more mechanical devices 318, one of which is indicated schematically in FIG. 3, to portions of bending substrate 302 to impart torque (e.g., rotational force) on bending substrate 302. For example, the fabricator may apply mechanical devices 318 to portions of bending substrate 302 near edges 320. In some cases, mechanical devices 318 may impart torque near edges of bending substrate 302 while pressurized fluid or gas 314 produces forces near a central region of bending substrate 302. Such a combination of torque and linear forces (e.g., produced by pressurized fluid or gas 314) may be applied in any proportional relation to one another. For example, force imparted on bending substrate 302 by pressurized fluid or gas 314 may be twice that imparted by mechanical devices 318. Such proportions, and whether or not both or only one of linear forces or torques are applied at the same time, may depend, at least in part, on physical details (e.g., stiffness, thickness, and so on) of image sensor chip 300 (before it is curved) and the desired shape of the curved image sensor chip 300. In some implementations, a fabricator may apply mechanical devices 318 to edges 322 of image sensor chip 302 in addition to, or in place of, applying mechanical devices 318 to edges 320 of bending substrate 302.

The combination of curved image sensor chip 300 and bending substrate 302 are hereinafter referred to as assembly 324. In some implementations, assembly 324 may be placed in contact with a rigid object, such as a backside substrate. In this fashion, the shape of assembly 324 may remain unchanged after the forces and/or torques are no longer applied to bending substrate 302.

Figure 4:
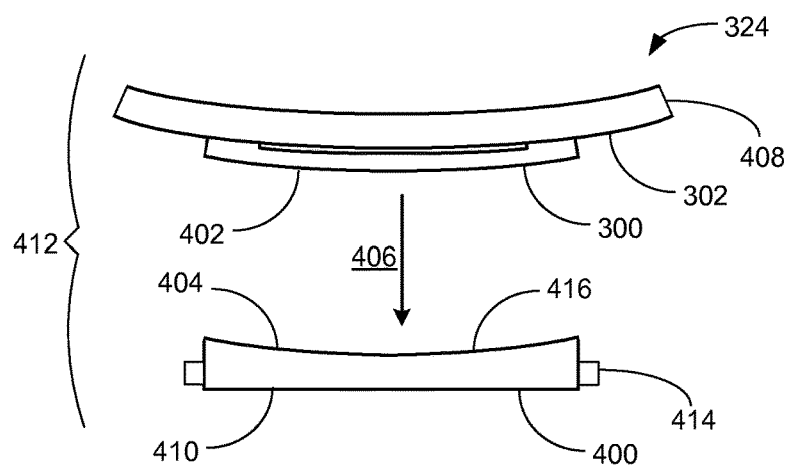
FIG. 4 is a side view of a curved image sensor chip and a bending substrate being placed onto a backside substrate, according to various example embodiments.

FIG. 4 is a side view of assembly 324 that includes curved image sensor chip 300 and bending substrate 302 being placed onto a backside substrate 400, according to various embodiments. In particular, a fabricator may join curved second surface 402 of curved image sensor chip 300, which is opposite to curved first surface 310, illustrated in FIG. 3, with a shaped surface 404 of backside substrate 400 so at least a portion of curved second surface 402 is in contact with shaped surface 404. Arrow 406 indicates the process of bringing curved second surface 402 and shaped surface 404 toward one another. In some implementations, a physical device such as a clamping or holding mechanism (not shown) may transport curved image sensor chip 300 by holding the curved image sensor chip by an edge 408 of bending substrate 302.

Backside substrate 400 includes bottom surface 410 that is opposite shaped surface 404. In a top view, backside substrate 400 may be square, rectangular, circular, or any other shape. Though curved image sensor chip 300 and backside substrate 400 are illustrated in FIG. 4 to have the same size, their sizes may be different. For example, backside substrate 400 may be larger than curved image sensor chip 300. Shaped surface 404 may have a shape that corresponds to a desired shape of curved image sensor chip 300. Shaped surface 404 may be spherical, parabolic, aspheric, or a compound shape having one or more inflection points, just to name a few examples.

Backside substrate 400 may comprise any of a number of materials that are rigid enough to resist a tendency that assembly 324 may have for straightening from a curved shape. Such materials may, for example, comprise metal, semiconductor material, plastics, glass, ceramic, and so on. The combination of assembly 324 and backside substrate 400 is hereinafter referred to as assembly 412.

Bottom surface 410 and/or sides of backside substrate 400 may include holes and/or protrusions 414 for mounting assembly 412 in an optical system, for example. Accordingly, assembly 412 may be a stand-alone optical device that can be incorporated in an optical system. An adhesive 416 may be placed on shaped surface 404 or on curved second surface 402 to bond shaped surface 404 and curved second surface 402 together.

Figure 5:
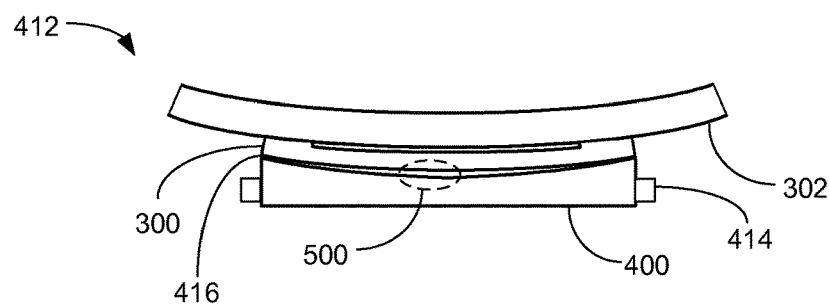
FIG. 5 is a side view of a curved image sensor chip, a bending substrate, and a backside substrate, according to various example embodiments.

FIG. 5 is a side view of assembly 412 that includes curved image sensor chip 300, bending substrate 302, and backside substrate 400, according to various embodiments. In some implementations, the shape of curved second surface 402 and shaped surface 404 may not be the same as one another. For example, when forces and/or torques (e.g., as depicted in FIG. 3) are no longer applied to bending substrate 302 for shaping image sensor chip 300 into a curved shape, the bending substrate and curved image sensor chip 300 may have a tendency to straighten (e.g., by resilience). In some cases, the forces and/or torques can be applied to over-shape curved image sensor chip 300 to compensate for such a tendency. In other cases, such straightening may lead to curved second surface 402 having a curvature or shape that is different from shaped surface 404. Such a difference may result in a gap or void 500 between any portion of curved second surface 402 and shaped surface 404. Such a gap or void need not adversely affect optical performance of curved image sensor chip 300 since the gap or void is on a side of image sensor chip 300 that is opposite to the curved light-sensitive portion 308 (FIG. 3). In some cases, adhesive 416 may fill in gap or void 500 so that assembly 412 is rigid and solid. However, such a gap or void may indicate that the shape of curved image sensor chip 300 is not precisely the desired shape. Accordingly, a fabricator may apply one or more forces to assembly 324 and backside substrate 400 to force the shape of curved image sensor chip 300 to take on the shape of shaped surface 404. In other words, a fabricator may squeeze assembly 324 and backside substrate 400 together so that curved image sensor chip 300 deforms to the shape of shaped surface 404. Concomitantly, any excess adhesive 416 may be pushed out from between assembly 324 and backside substrate 400.

Figure 6:
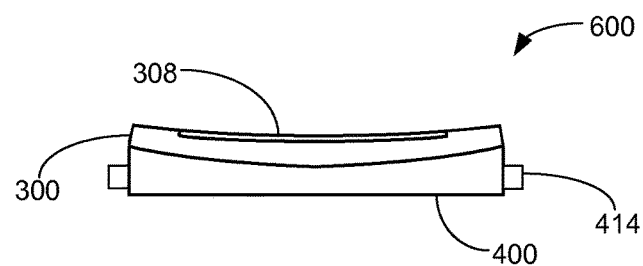
FIG. 6 is a side view of a curved image sensor chip and a backside substrate subsequent to removal of a bending substrate, according to various example embodiments.

FIG. 6 is a side view of curved image sensor chip 300 and backside substrate 400 subsequent to removal of bending substrate 302, according to various embodiments. Such removal exposes light-sensitive portion 308 so that light-sensitive portion 308 can receive light, which may be provided by an optical system that incorporates image sensor chip 300. The combination of image sensor chip 300 and backside substrate 400 is referred to as a shaped light sensor module 600. Shaped light sensor module 600 may be incorporated as an optical element in an optical system and may be mounted in the optical system using holes and/or protrusions 414. In particular, a fabricator may build shaped light sensor module 600 and provide shaped light sensor module 600 to an assembler (which may be the same or different entity as the fabricator). The assembler may use shaped light sensor module 600 as an image sensor, which may be incorporated in an optical system.

Figure 7:
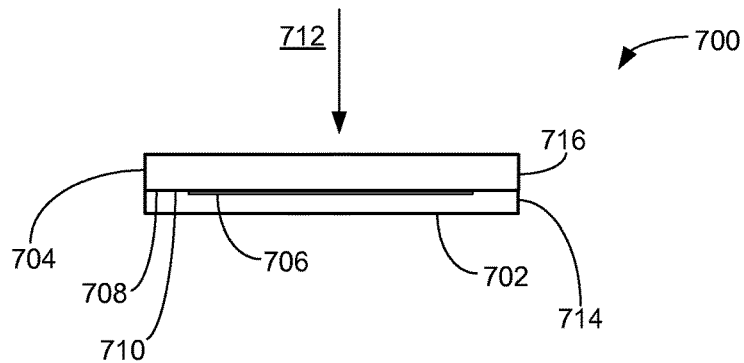
FIG. 7 is a side view of an image sensor chip and a bending substrate placed onto the image sensor chip by deposition, according to various example embodiments.

FIG. 7 is a side view of a configuration 700 that includes an image sensor chip 702 and a bending substrate 704 placed onto the image sensor chip by deposition, according to various embodiments. Image sensor chip 702 includes a light-sensitive portion 706, which may be the same as or similar to light-sensitive portion 104 illustrated in FIG. 1, for example. Bending substrate 704 is deposited onto a first surface 708 of image sensor chip 702. A fabricator may use any of a number of deposition techniques to place bending substrate onto image sensor chip 702. Some examples of deposition techniques are spin coating, vapor deposition, sputtering, and so on. In various implementations, portions of first surface 708 need not be in contact with bending substrate 704. For example, bending substrate 704 may be deposited directly on particular areas of first surface 708 while other particular areas of first surface 708 may include a non-contact area (not shown) between bending substrate 704 and first surface 708. Such a non-contact area may be an area that lacks an adhesive or bonding aspect that is present between first surface 708 and bending substrate 704. Such non-contact areas thus cannot transfer shear forces or stress from bending substrate 704 to first surface 708.

First surface 708 includes light-sensitive portion 706, which is the light-sensitive portion of image sensor chip 702. First surface 708 may also include an inactive region 710, which may be the same as or similar to inactive region 108 illustrated in FIG. 1, for example. Arrow 712 indicates a direction of incident light which image sensor chip 702 is configured to receive.

An edge 714 of image sensor chip 702 may or may not align with an edge 716 of bending substrate 704. In some implementations, image sensor chip 702 may extend beyond edge 716 of bending substrate 704.

Bending substrate 704 may comprise any of a number of materials, such as, for example, plastics, polymers, other organic compounds, combinations thereof, or the like. A fabricator may select materials for bending substrate 704 while considering a number of features of the materials, such as ease of deposition, adhesive strength adequate for transferring stresses and shear forces across an interface between bending substrate 704 and image sensor chip 702, and chemical and thermal stability.

In particular, selection of material for bending substrate 704 may be based, at least in part, on thermal properties of the material. For example, the selected material can be applied to image sensor chip 702 at temperatures substantially below where damage to image sensor chip 702 may occur. Excessive temperatures may damage light-sensitive portion 706, the semiconductor substrate, and/or the inactive region of image sensor chip 710. For example, in the case of silicon, temperatures below about 200 degrees centigrade may be safe and not damage image sensor chip 702. Similarly, such temperature considerations apply to a process for removing the material used for bending substrate 704 from image sensor chip 702.

In addition to temperature considerations, selection of material for bending substrate 704 may be based, at least in part, on ability to apply the material to image sensor chip 702 and to subsequently remove the material from image sensor chip 702. For example, a material may be selected so that it is relatively easy to deposit the material onto image sensor chip 702, and that it releases, vaporizes, or disintegrates from image sensor chip 702 without leaving any residual material or without changing any physical characteristics of light-sensitive portion 708. For example, a fabricator may use a thermal de-bonding process to release bending substrate 704 from image sensor chip 702. In some implementations, such a process may be performed in a nitrogen purged tube furnace.

In some examples, a thickness of bending substrate 704 may be at least several times greater than a thickness of image sensor chip 702. For a particular example, image sensor chip 702 may be about 5 to 10 microns thick and bending substrate 704 may be about 50 to 100 microns thick. The thickness of image sensor chip 702 may be much greater than 10 microns, and bending substrate 704 may be at least several times thicker than image sensor chip 702, which may up to one or more millimeters in thickness. In some implementations, different portions of bending substrate 704 may have different thicknesses. Selection of material for bending substrate 704 may be based, at least in part, on stiffness of the material as compared to the stiffness of image sensor chip 702. The stiffness of image sensor chip 702 may depend, at least in part, on the substrate material of image sensor chip 702, which may be silicon or germanium, and thickness. The stiffness of bending substrate 704 may depend, at least in part, the material and thickness used for bending substrate 704. In some implementations, the material and thickness used for bending substrate 704 may be different for different portions of bending substrate 704. Accordingly, stiffness of bending substrate 704 may vary over different portions of image sensor chip 702. For example, a portion of bending substrate 704 that is over a central region of image sensor chip 702 may be relatively stiff compared to portions of bending substrate 704 that are over edge regions of image sensor chip 702.

Figure 8:
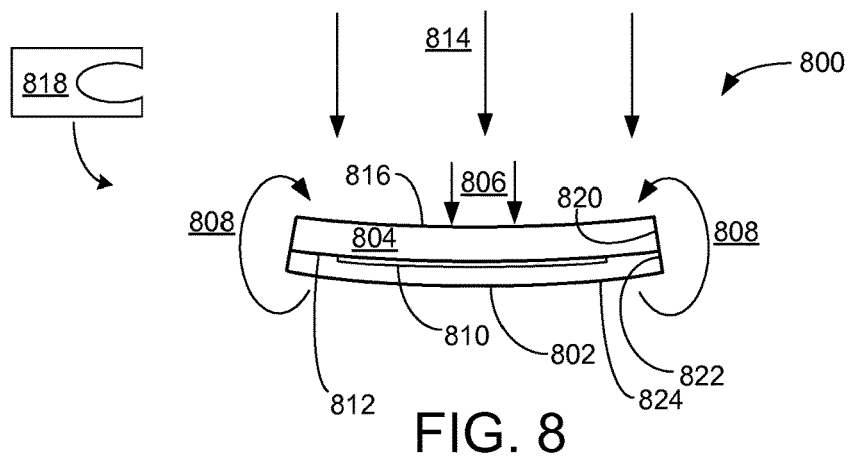
FIG. 8 is a side view of a curved image sensor chip and a bending substrate subjected to applied forces and torques, according to various example embodiments.

FIG. 8 is a side view of a configuration 800 that includes a curved image sensor chip 802 and a bending substrate 804 subjected to various applied forces and torques, according to some embodiments. In some examples, curved image sensor chip 802 and bending substrate 804 may be the same as or similar to image sensor chip 702 and bending substrate 704, respectively, prior to the bending illustrated in FIG. 8. For example, a fabricator may apply forces 806 and/or torques 808 to bending substrate 804 to result in curved image sensor chip 802. Curved image sensor chip 802 includes a curved light-sensitive portion 810 disposed on a curved first surface 812.

A fabricator may apply any of a number of types of forces to bending substrate 804 to bend image sensor chip 802. For example, pressurized fluid or gas adjacent to bending substrate 804 may impart forces 806 on bending substrate 804. In some implementations, a pressurized fluid or gas 814, indicated by arrows in FIG. 8, may comprise a contained pressurized fluid or gas pressing onto at least a portion of surface 816 of bending substrate 804. Different portions of contained pressurized fluid or gas 814 may apply forces 806 on surface 816 that vary by location across surface 816. In some cases, mechanical contact by a solid object (not shown) having any of a number of shapes may replace pressurized fluid or gas 814 and impart forces 806.

In other implementation, a fabricator may apply one or more mechanical devices 818, one of which is indicated schematically in FIG. 8, to portions of bending substrate 804 to impart torque (e.g., rotational force) on bending substrate 804. For example, the fabricator may apply mechanical devices 818 to portions of bending substrate 804 near edges 820. In some cases, mechanical devices 818 may impart torque near edges of bending substrate 804 while pressurized fluid or gas 814 produces forces near a central region of bending substrate 804. Such a combination of torque and linear forces (e.g., produced by pressurized fluid or gas 814)

may be applied in any proportional relation to one another. For example, force imparted on bending substrate 804 by pressurized fluid or gas 814 may be twice that imparted by mechanical devices 818. Such proportions, and whether or not both or only one of linear forces or torques are applied at the same time, may depend, at least in part, on physical details (e.g., stiffness, thickness, and so on) of image sensor chip 802 (before it is curved) and the desired shape of the curved image sensor chip 802. In some implementations, a fabricator may apply mechanical devices 818 to edges 822 of image sensor chip 802 in addition to, or in place of, applying mechanical devices 818 to edges 820 of bending substrate 804. A curved second surface 824 of curved image sensor chip 802, which is opposite to curved first surface 812, may be placed in contact with a rigid object, such as a backside substrate. In this fashion, the shape of configuration 800 may remain unchanged after the forces and/or torques are no longer applied to bending substrate 804.

Figure 9:
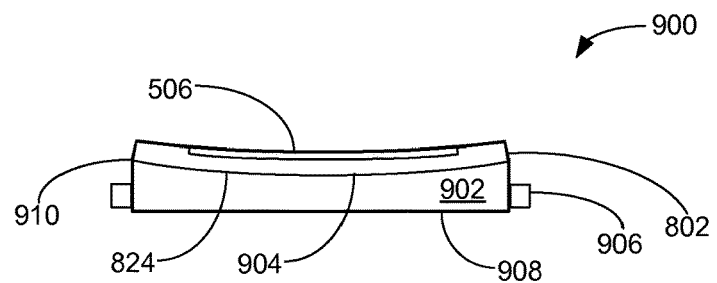
FIG. 9 is a side view of a curved image sensor chip and a backside substrate, according to various example embodiments.

FIG. 9 is a side view of an assembly 900 that includes curved image sensor chip 802 and a backside substrate 902, according to various embodiments. In particular, a fabricator may join curved second surface 824 of curved image sensor chip 802 with a shaped surface 904 of backside substrate 902 so at least a portion of curved second surface 824 is in contact with shaped surface 904. In some implementations, a physical device such as a clamping or holding mechanism (not shown) may transport curved image sensor chip 802 by holding the curved image sensor chip by edge 820 of bending substrate 804.

In some implementations, a fabricator may remove bending substrate 804 from curved image sensor chip 802 after joining curved image sensor chip 802 to backside substrate 902. Bending substrate 804 may be removed by any of a number of techniques that do not harm light-sensitive portion 810. For example, bending substrate 804 may comprise a material that evaporates, vaporizes, or disintegrates upon sufficient heating. In other examples, bending substrate 804 may comprise a material that can be chemically etched or dissolved.

Removal of bending substrate 804 exposes light-sensitive portion 810 so that light-sensitive portion 810 can receive light, which may be provided by an optical system that incorporates curved image sensor chip 802. Assembly 900 may be incorporated as an optical element in an optical system and may be mounted in the optical system using holes and/or protrusions 906 that may be disposed on sides or a bottom surface 908 of backside substrate 902. Bottom surface 908 is opposite shaped surface 904. In particular, a fabricator may build assembly 900 and provide assembly 900 to an assembler (which may be the same entity as the fabricator). The assembler may use assembly 900 as an image sensor, which may be incorporated in an optical system.

In a top view, backside substrate 902 may be square, rectangular, circular, or any other shape. Though curved image sensor chip 802 and backside substrate 902 are illustrated in FIG. 9 to have the same size, their sizes may be different. For example, backside substrate 902 may be larger than curved image sensor chip 802. Shaped surface 904 may have a shape that corresponds to a desired shape of curved image sensor chip 802. Shaped surface 904 may be spherical, parabolic, aspheric, or a compound shape having one or more inflection points, just to name a few examples.

Materials and other characteristics of backside substrate 902 may be the same as or similar to backside substrate 400 described above. An adhesive 910 may be placed on shaped surface 904 or on curved second surface 824 to bond shaped surface 904 and curved second surface 824 together.

In some implementations, the shape of curved second surface 824 and shaped surface 904 may not be the same as one another. For example, when forces and/or torques (e.g., as depicted in FIG. 8) are no longer applied to bending substrate 804 for shaping image sensor chip 802 into a curved shape, the bending substrate and curved image sensor chip 802 may have a tendency to straighten (e.g., by resilience). In some cases, the forces and/or torques can be applied to over-shape curved image sensor chip 802 to compensate for such a tendency. In other cases, such straightening may lead to curved second surface 824 having a curvature or shape that is different from shaped surface 904. Accordingly, a fabricator may apply one or more forces to configuration 800 and backside substrate 902 to force the shape of curved image sensor chip 802 to take on the shape of shaped surface 804. In other words, a fabricator may squeeze configuration 800 and backside substrate 902 together so that curved image sensor chip 802 deflects to the shape of shaped surface 904.

Figure 10:
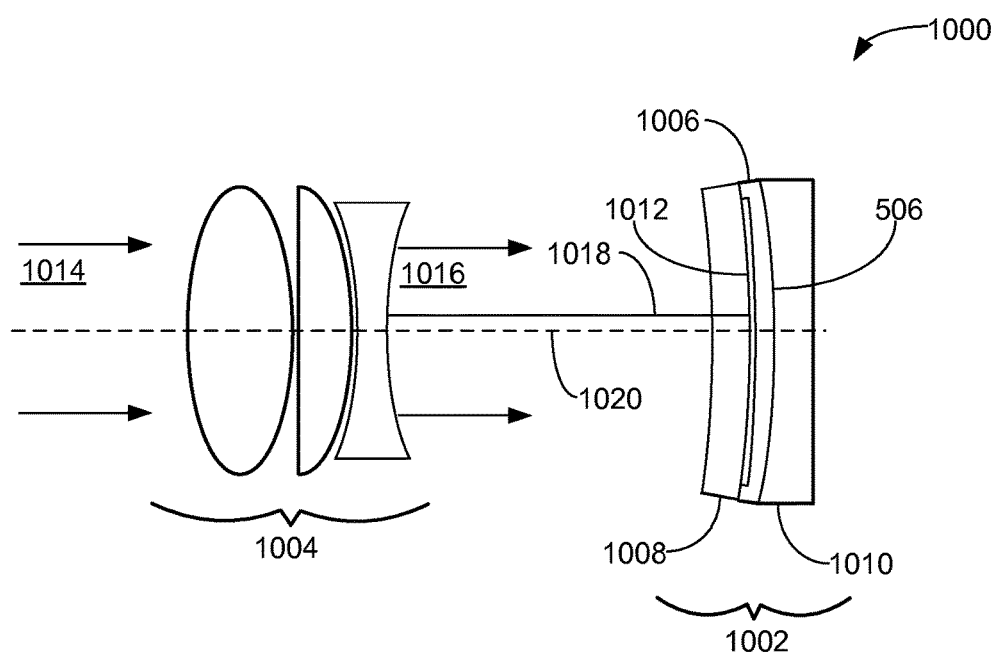
FIG. 10 is a cross-section view of an optical system that includes a curved image sensor chip, a bending substrate, and a backside substrate, according to various example embodiments.

FIG. 10 is a cross-section view of an optical system 1000 that includes an image sensor module 1002 and a lens assembly 1004, according to various embodiments. In particular, image sensor module 1002 comprises a curved image sensor chip 1006, a bending substrate 1008, and a backside substrate 1010. Curved image sensor chip 1006 includes a light-sensitive portion 1012. Bending substrate 1008 may be a transparent material that allows light from lens assembly 1004 to reach light-sensitive portion 1012. Curved image sensor chip 1006, bending substrate 1008, and backside substrate 1010 may be similar to or the same as curved image sensor chip 300 or 802, bending substrates 302 or 804, and backside substrate 400 and 902, illustrated in FIGS. 4, 8, and 9, respectively. In some implementations, image sensor module 1002 need not include backside substrate 1010. In this case, bending substrate may be sufficiently rigid to maintain the curved shape of curved image sensor chip 1006. Bending substrate 1008 may comprise a material that can be made to be rigid subsequent to a process of bending the curved image sensor chip 1006. For example, such a material may become rigid at relatively low temperatures while being flexible and malleable at higher temperatures. Thus, a bending process to shape curved image sensor chip 1006 may occur at elevated temperatures, and then a cooling process "freezes" the shape of curved image sensor chip 1006.

Curved image sensor chip 1006 (or more precisely, light-sensitive portion 1012) may have a shape that gives rise to a focal length. Such a focal length may be considered when placing image sensor module 1002 in optical system 1000. In particular, lens assembly 1004 may be designed to receive light 1014, optically operate on the light, and produce light output 1016 that focuses an image onto curved image sensor chip 1006, which may be a distance 1018 from lens assembly 1004. Distance 1018 may be at least approximately equal to a focal length of curved image sensor chip 1006. In some implementations, an inverse of the focal length of curved image sensor chip 1006 is at least approximately equal to the radius of curvature of curved image sensor chip 1006. Lens assembly 1004 and image sensor module 1002 may be aligned along an optical axis 1020.

Figure 11:
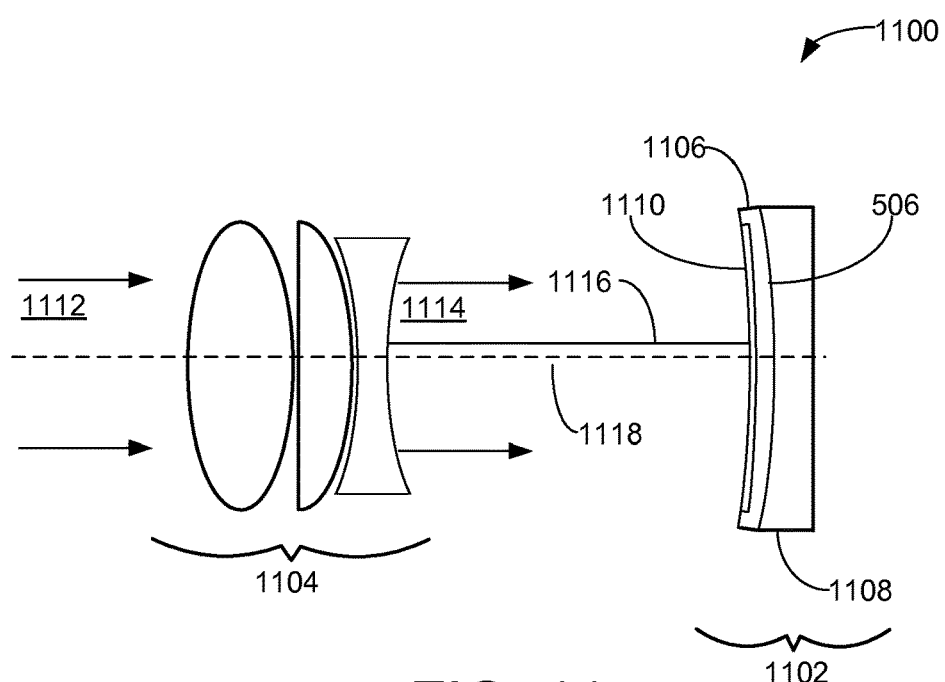
FIG. 11 is a cross-section view of an optical system that includes a curved image sensor chip and a backside substrate, according to various example embodiments.

FIG. 11 is a cross-section view of an optical system 1100 that includes an image sensor module 1102 and a lens assembly 1104, according to various embodiments. Lens assembly 1104 may similar to or the same as lens assembly 1004 illustrated in FIG. 10, for example. Image sensor module 1102 comprises a curved image sensor chip 1106 and a backside substrate 1108. Though image sensor module 1102 does not include a bending substrate, a fabricator may have used a bending substrate to produce the shape of curved image sensor chip 1106. Such a bending substrate may have been removed subsequent to attaching curved image sensor chip 1106 to backside substrate 1108.

Curved image sensor chip 1106 includes a light-sensitive portion 1110, which is exposed to light (e.g., which may be an image at the surface of light-sensitive portion 1110) produced by lens assembly 1104. Curved image sensor chip 1106 and backside substrate 1108 may be similar to or the same as curved image sensor chip 300 or 802, and backside substrate 400 and 902, illustrated in FIGS. 4, 8, and 9, respectively.

Curved image sensor chip 1106 (or more precisely, light-sensitive portion 1110) may have a shape suitable for a lens of a particular focal length. Such a focal length may be considered when placing image sensor module 1102 in optical system 1100. In particular, lens assembly 1104 may be designed to receive light 1112, optically operate on the light, and produce light output 1114 that focuses an image onto curved image sensor chip 1106, which may be a distance 1116 from lens assembly 1104. Distance 1116 may be at least approximately equal to a focal length of curved image sensor chip 1106. In some implementations, an inverse of the focal length of curved image sensor chip 1106 is at least approximately equal to the radius of curvature of curved image sensor chip 1106. Lens assembly 1104 and image sensor module 1102 may be aligned along an optical axis 1118.

Figure 12:
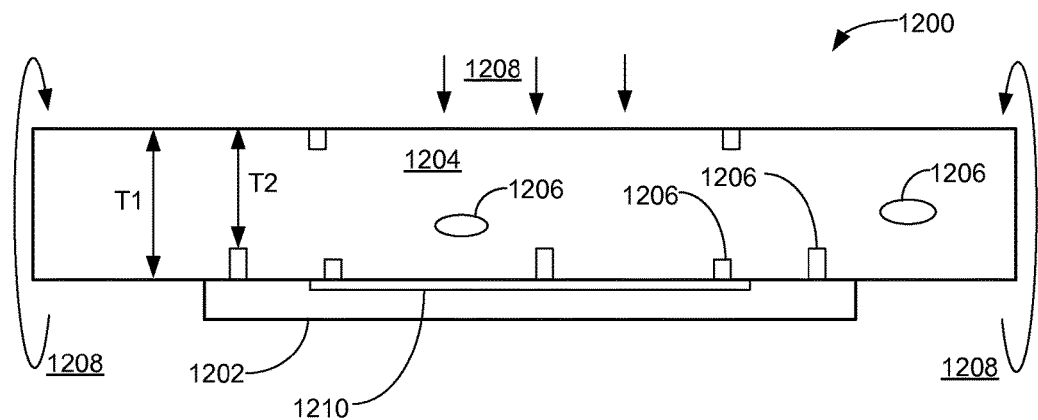
FIG. 12 is a side view of an image sensor chip and a bending substrate that includes various notches and grooves, according to various example embodiments.

FIG. 12 is a side view of a configuration 1200 comprising an image sensor chip 1202 and a bending substrate 1204, which includes various notches and grooves 1206, according to some embodiments. Though edges of bending substrate 1204 are illustrated to extend beyond edges of image sensor chip 1202, such edges may or may not align with one another. In some implementations, edges of image sensor chip 1202 extend to or beyond edges of bending substrate 1204, which may be the case if bending substrate 1204 is deposited onto image sensor chip 1202.

Notches and/or grooves 1206 may be present in bending substrate 1204 to at least partially control quantity and distribution of bending stresses in bending substrate 1204 in response to applied forces and/or torques 1208. By introducing such control of bending stresses, the shape of deformation of bending substrate 1204 in response to applied forces and/or torques 1208 can be tailored to impart a desired shape to image sensor chip 1202. Notches and/or grooves 1206 affect the thickness of portions of bending substrate 1204. For example, bending substrate 1204 may have a thickness T1 where notches and/or grooves 1206 are not located. Bending substrate 1204, however, may be thinned to a thickness T2 by notches and/or grooves 1206. Such varying thicknesses of bending substrate 1204 may affect the degree of bending of bending substrate 1204.

In addition to varying thickness due to the presence of notches and/or grooves 1206, different portions of bending substrate 1204 may have different thicknesses in different regions. In other words, T1 may be different for different portions of bending substrate 1204. Also, the material used for bending substrate 1204 may be different for different portions of bending substrate 1204. Accordingly, stiffness of bending substrate 1204 may vary over different portions of image sensor chip 1202 based, at least in part, on presence and locations of notches and/or grooves 1206, materials of bending substrate 1204, and/or thicknesses of various portions of bending substrate 1204.

Any number of notches and/or grooves 1206 may be located in any portion of bending substrate 1204. Notches and/or grooves 1206 may be disposed adjacent to a light-sensitive portion 1210 of image sensor chip 1202. Notches and/or grooves 1206 may be located within bending substrate 1204. Notches and/or grooves 1206 may have any shape, size, or depth. In some implementations, notches and/or grooves 1206 may be filled with a material different from that of bending substrate 1204.

Figure 13:
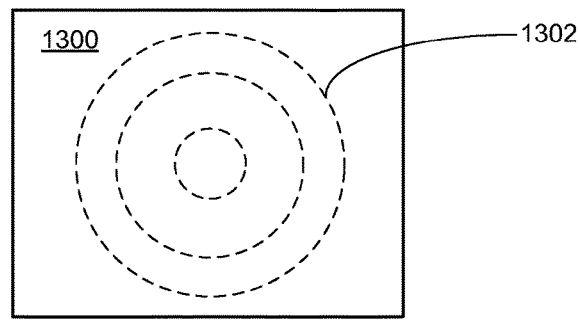
FIG. 13 is a top view of a bending substrate that includes a series of notches and/or grooves that are distributed concentrically about a center region of the bending substrate, according to a number of example embodiments

FIG. 13 is a top view of a bending substrate 1300 that includes a series of notches and/or grooves 1302 that are distributed concentrically about a center region of bending substrate 1300, according to a number of embodiments. Distances between or among the concentric notches and/or grooves 1302 may be varied to affect the particular shape of bending of an image sensor chip (not shown in FIG. 13) that is attached (e.g., bonded or glued) to bending substrate 1300. Notches and/or grooves 1302 may be located on a surface of bending substrate 1300 that is the same side or the opposite side as the image sensor chip.

Figure 14:
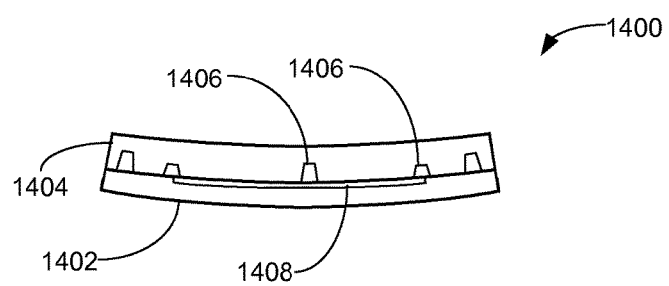
FIG. 14 is a side view of a curved image sensor chip and a bending substrate that includes various notches and grooves, according to various example embodiments.

FIG. 14 is a side view of a configuration 1400 comprising a curved image sensor chip 1402 and a bending substrate 1404, which includes various notches and grooves 1406, according to some embodiments. For example, configuration 1400 may be the same as or similar to configuration 1200 subject to forces and/or torques 1208, as depicted in FIG. 12. Curved image sensor chip 1402 includes a light-sensitive portion 1408 that is also curved. Such curvature of image sensor chip 1402 and light-sensitive portion 1408 may depend, at least in part, on characteristics of notches and/or grooves 1406, such as their placement, shape, size, and so on.

Figure 15:
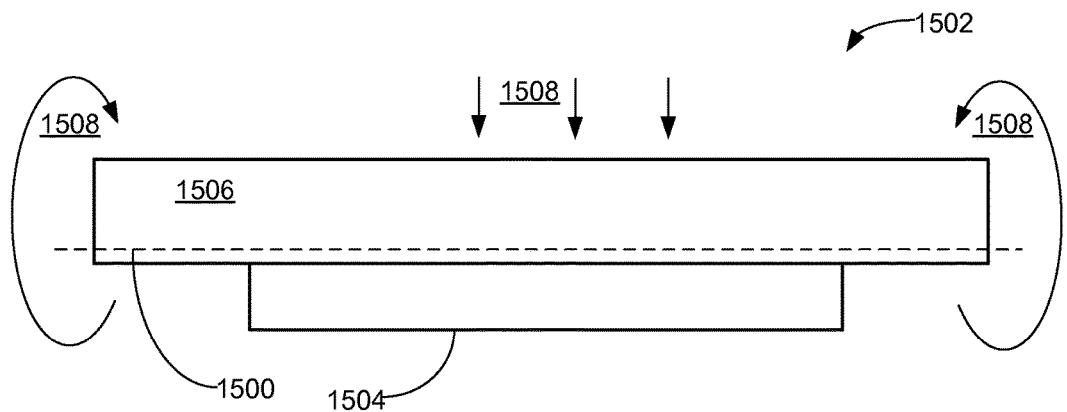
FIG. 15 is a side view illustrating a neutral axis, an image sensor chip, and a bending substrate, according to various example embodiments.

FIG. 15 is a side view illustrating a neutral axis 1500 of a configuration 1502 that includes an image sensor chip 1504 and a bending substrate 1506, according to various embodiments. Neutral axis 1500 arises from applied forces and/or torques 1508. The neutral axis is a virtual surface that separates material that is in tension from material that is in compression. For example, in response to forces and/or torques 1508, bending substrate 1506 is in compression above 1500 and in tension below neutral axis 1500. Image sensor chip 1504 is located below neutral axis 1500 so it is in tension. The location of neutral axis 1500 with respect to the location of image sensor chip 1504 may affect the amount of bending of image sensor chip 1504. The location and "shape" of neutral axis 1500 may depend, at least in part, on a number of factors, such as placement, shape, and size of notches and/or grooves that may be present in bending substrate 1506, as well as stiffnesses and thicknesses of image sensor chip 1504 and bending substrate 1506. Thus, a fabricator may control where to locate neutral axis 1500 based on these factors.

Figure 16:
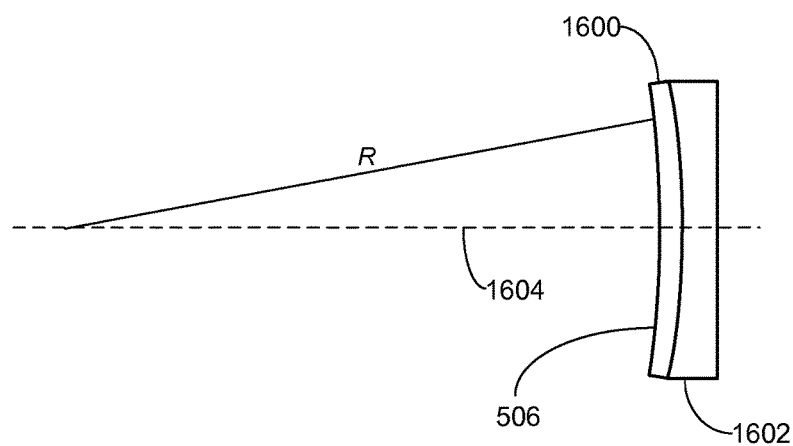
FIG. 16 is a cross-section view that illustrates curvature of a curved image sensor chip and a backside substrate, according to various example embodiments.

FIG. 16 is a cross-section view that illustrates curvature of a curved image sensor chip 1600, which is attached to a backside substrate 1602, according to various embodiments. The combination of a curved image sensor chip bonded to a backside substrate may comprise a stand-alone optical device that may be subsequently incorporated into optical systems. An optical axis 1604 of such optical systems is shown in relation to image sensor chip 1600. A focal length of image sensor chip 1600, which is based, at least in part, on the curved shape of image sensor chip 1600, may be a significant factor when image sensor chip 1600 is incorporated in an optical system. When the shape of image sensor chip 1600 is substantially spherical, the focal length of image sensor chip 1600 may be at least approximately equal to the inverse of the radius of curvature R of image sensor chip 1600. If image sensor chip 1600 has an aspheric shape, then the radius of curvature of image sensor chip 1600 changes with distance from optical axis 1604. An optical system that incorporates image sensor chip 1600 may be designed to accommodate such a variable radius of curvature.

Figure 17:
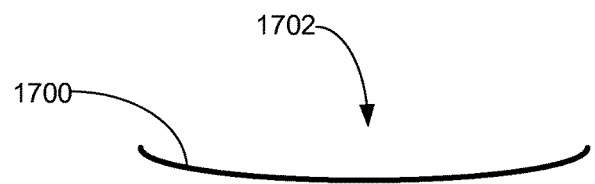
FIGS. 17 and 18 are cross-section views of the light-sensitive surface of curved image sensor chips, according to various example embodiments.
Figure 18:
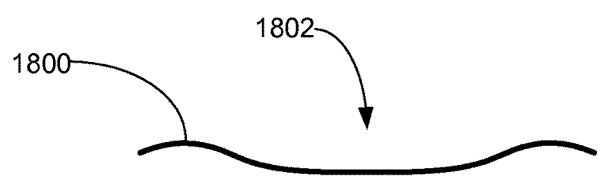

FIGS. 17 and 18 are cross-section views illustrating shapes of light-sensitive portions of curved image sensor chips, according to various embodiments. In FIG. 17, a light-sensitive portion 1700 of a curved image sensor chip 1702 has a spherical or aspheric shape. Such a shape has no inflection points. Light-sensitive portion 1700 is concave. On the other hand, as illustrated in FIG. 18, a light-sensitive portion 1800 of a curved image sensor chip 1802 has a complex shape that includes one or more inflection points. Portions of light-sensitive portion 1800 may include spherical or aspheric shapes. Such complex shapes may be useful in a number of optical systems. Bending substrates, such as those described above, may be designed, in combination with applied forces and/or torques, to produce complex shapes of light-sensitive portion 1800.

Figure 19:
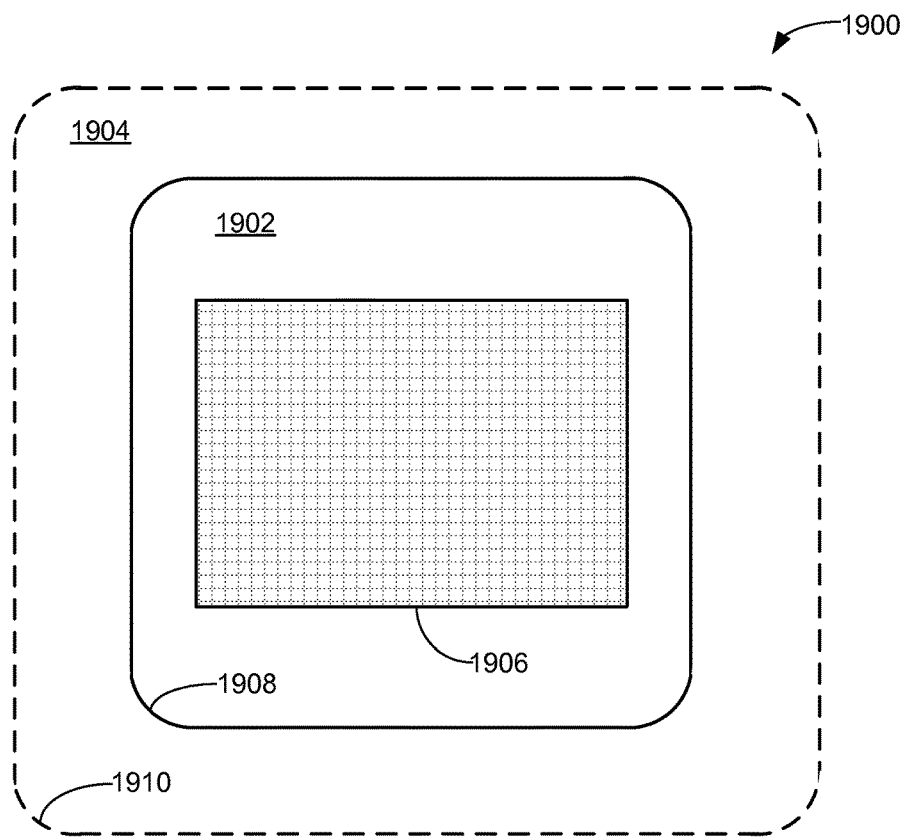
FIG. 19 is a top view of an image sensor chip and a bending substrate, according to various example embodiments.

FIG. 19 is a top view of a configuration 1900 that includes an image sensor chip 1902 and a bending substrate 1904, according to various embodiments. Bending substrate 1904 is on the side of image sensor chip 1902 that includes a light-sensitive portion 1906. Though edges of bending substrate 1904 are illustrated in FIG. 19 to extend beyond edges of image sensor chip 1902, such edges may be aligned with one another. One or more corners 1908 of image sensor chip 1902 may be rounded to avoid relatively sharp corners that tend to concentrate stresses, which may arise from forces and/or torques applied to bending substrate 1904. Such concentrated stresses may lead to undesirable cracking or buckling of image sensor chip 1902. For example, cracks that begin at or near regions of corners 1908 may propagate across image sensor chip 1902 in any direction, and may render image sensor chip 1902 useless. In some implementations, bending substrate 1904 may include rounded corners 1910.

Figure 20:
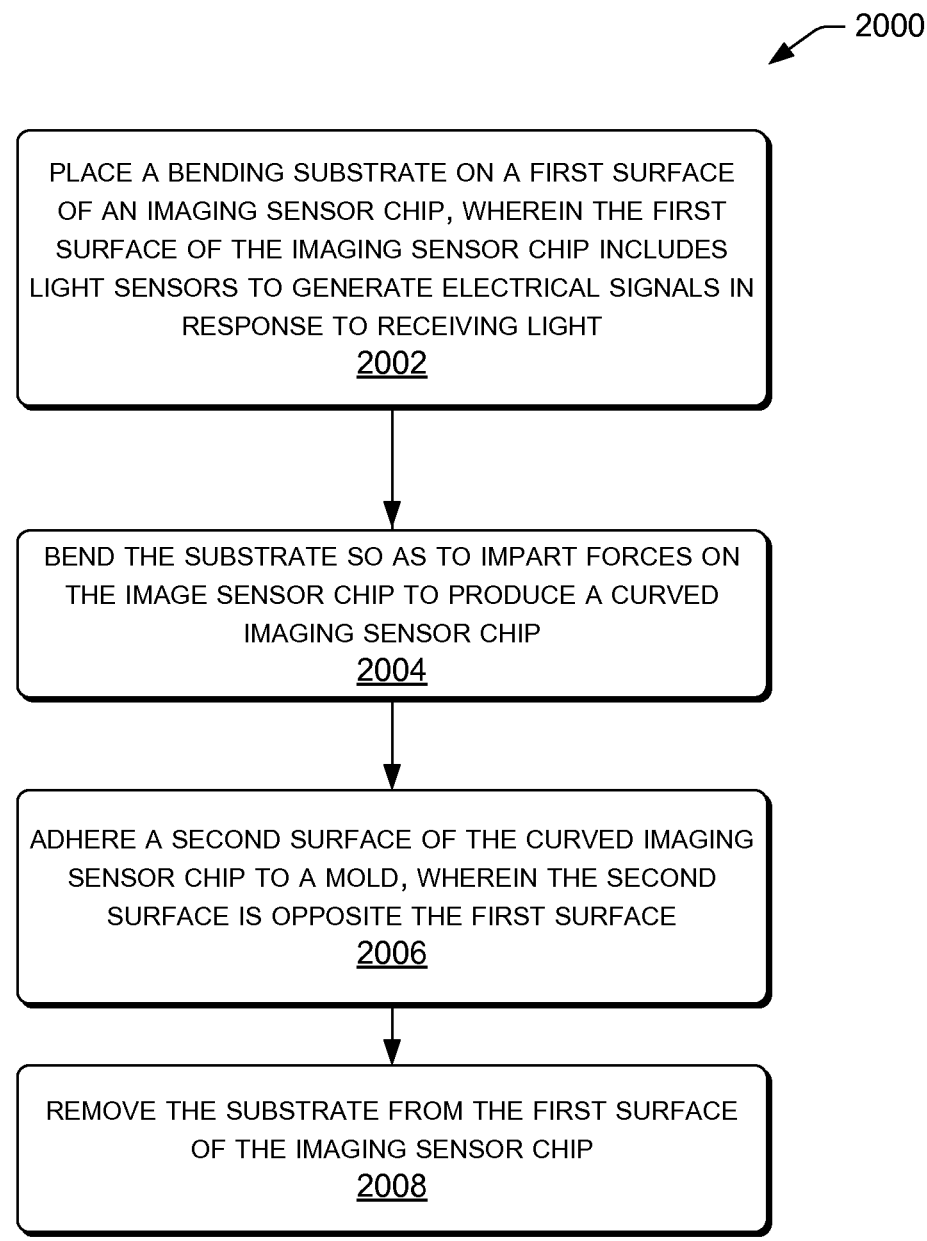
FIG. 20 is a flow diagram illustrating example processes for bending an image sensor chip, according to some example embodiments.

FIG. 20 is a flow diagram illustrating an example process 2000 for bending an image sensor chip, according to some embodiments. For example, such an image sensor chip may be the same as or similar to image sensor chip 300 or image sensor chip 802 shown in FIGS. 3 and 8, respectively. Process 2000 may be similar to or the same as process depicted in FIGS. 2-6 and 7-9, and may be performed by a fabricator. At block 2002, a fabricator may place a bending substrate on a first surface of an imaging sensor chip. The first surface of the imaging sensor chip includes light sensors to generate electrical signals in response to receiving light. At block 2004, the fabricator may bend the bending substrate so as to impart forces on the image sensor chip to produce a curved imaging sensor chip. At block 2006, the fabricator may adhere a second surface of the curved imaging sensor chip to a backside substrate. The second surface is opposite the first surface of the curved imaging sensor chip. At block 2008, the fabricator may remove the bending substrate from the first surface of the imaging sensor chip.

Example Clauses

A: A method comprising: placing a bending substrate on a first surface of an imaging sensor chip, wherein the first surface of the imaging sensor chip includes light sensors to generate electrical signals in response to receiving light; and bending the bending substrate so as to impart forces on the image sensor chip to produce a curved imaging sensor chip.

B. The method as paragraph A recites, further comprising: adhering a second surface of the curved imaging sensor chip to a backside substrate, wherein the second surface is opposite the first surface; and removing the bending substrate from the first surface of the imaging sensor chip.

C. The method as paragraph B recites, wherein removing the bending substrate from the first surface of the imaging sensor chip comprises thermally de-bonding the bending substrate from the first surface of the imaging sensor chip.

D. The method as paragraph B recites, wherein the backside substrate includes at least one curved surface having a radius of curvature at least approximately equal to an inverse focal length of the first surface of the imaging sensor chip.

E. The method as paragraph A recites, wherein placing the bending substrate on the first surface of the imaging sensor chip comprises adhering the bending substrate to the first surface of the imaging sensor chip using an adhesive.

F. The method as paragraph A recites, wherein placing the bending substrate on the first surface of the imaging sensor chip comprises forming the bending substrate on the first surface of the imaging sensor chip using a deposition process.

G. The method as any one of paragraphs A-F recites, further comprising: before placing the bending substrate on the first surface of the imaging sensor chip, forming notches or grooves in the bending substrate.

H. The method as any one of paragraphs A-G recites, wherein bending the bending substrate comprises applying a pressurized gas or liquid onto the bending substrate.

I. The method as any one of paragraphs A-H recites, wherein the first surface of the curved imaging sensor chip is concave.

J. An apparatus comprising: a curved imaging sensor chip having a first side and an opposite second side, wherein the first side includes light sensors to generate electrical signals in response to receiving light; and a bending substrate covering the first side of the curved imaging sensor chip.

K. The apparatus as paragraph J recites, further comprising a backside substrate covering the second side of the curved imaging sensor chip.

L. The apparatus as any one of paragraphs J-K recites, wherein the bending substrate comprises a deposited material that is bonded to the first side of the curved imaging sensor chip by deposition.

M. The apparatus as any one of paragraphs J-K recites, wherein the bending substrate is bonded to the first side of the curved imaging sensor chip by an adhesive.

N. The apparatus as any one of paragraphs J-M recites, wherein the bending substrate includes one or more notches or grooves.

O. The apparatus as any one of paragraphs J-N recites, wherein the curved imaging sensor chip includes corners that are rounded.

P. The apparatus as any one of paragraphs J-O recites, wherein the curved imaging sensor chip has a radius of curvature that is at least approximately equal to an inverse focal length of the first side of the curved imaging sensor chip.

Q. A system comprising: a curved imaging sensor chip having a first side and an opposite second side, wherein the first side includes light sensors to generate electrical signals in response to receiving light; a substrate covering the first side of the curved imaging sensor chip; and a backside substrate covering the second side of the curved imaging sensor chip.

R. The system as paragraph Q recites, further comprising one or more lenses to direct electromagnetic energy to the first side of the curved imaging sensor chip.

S. The system as any one of paragraphs Q-R recites, wherein the curved imaging sensor chip comprises germanium and the directed electromagnetic energy comprises infrared energy.

T. The system as any one of paragraphs Q-S recites, wherein a stiffness of the curved imaging sensor chip is substantially greater than a stiffness of the bending substrate.

CONCLUSION

Although the subject matter has been described in language specific to structural features and/or methodological acts, it is to be understood that the subject matter defined in the appended claims is not necessarily limited to the specific features or acts described. Rather, the specific features and steps are disclosed as example forms of implementing the claims.

All of the methods and processes described above may be embodied in, and fully automated via, software code modules executed by one or more general purpose computers or processors. The code modules may be stored in any type of computer-readable medium, computer storage medium, or other computer storage device. Some or all of the methods may alternatively be embodied in specialized computer hardware such as, for example, a quantum computer or quantum annealer.

Conditional language such as, among others, "can," "could," "may" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art.

It should be emphasized that many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
adhering or depositing a bending substrate on a first surface of an imaging sensor chip, wherein the first surface of the imaging sensor chip includes one or more light sensors to generate electrical signals in response to receiving light onto the first surface, wherein a stiffness of the bending substrate varies over different portions of the imaging sensor chip due to one or both of notches or grooves in the bending substrate, wherein the stiffness of the bending substrate is based on a thickness of the bending substrate, wherein the thickness of the bending substrate are different at different portions of bending substrate, and wherein the one or both of the notches or the grooves are distributed concentrically about a center region of the bending substrate; and
applying forces to the bending substrate so as to bend the bending substrate and to resultantly impart bending forces, which are based at least in part on the stiffness of the bending substrate, on the image sensor chip to produce a curved imaging sensor chip.

2. The method of claim 1, further comprising:
adhering a second surface of the curved imaging sensor chip to a backside substrate, wherein the second surface is opposite the first surface; and
subsequent to adhering the second surface, removing the bending substrate from the first surface of the curved imaging sensor chip.

3. The method of claim 2, wherein removing the bending substrate from the first surface of the curved imaging sensor chip comprises thermally de-bonding the bending substrate from the first surface of the curved imaging sensor chip.

4. The method of claim 2, wherein the backside substrate includes at least one curved surface having a radius of curvature at least approximately equal to an inverse focal length of the first surface of the curved imaging sensor chip.

5. The method of claim 1, wherein adhering or depositing the bending substrate on the first surface of the imaging sensor chip comprises adhering the bending substrate to the first surface of the imaging sensor chip using an adhesive.

6. The method of claim 1, wherein adhering or depositing the bending substrate on the first surface of the imaging sensor chip comprises forming the bending substrate on the first surface of the imaging sensor chip using a deposition process.

7. The method of claim 1, further comprising:
before adhering or depositing the bending substrate on the first surface of the imaging sensor chip, forming the one or both of the notches or the grooves in the bending substrate, wherein the stiffness of the bending substrate is further based on the notches or the grooves in the bending substrate.

8. The method of claim 1, wherein bending the bending substrate comprises applying a pressurized gas or liquid onto the bending substrate.

9. The method of claim 1, wherein the first surface of the curved imaging sensor chip is concave.

10. An apparatus comprising:
a curved imaging sensor chip having a first side and an opposite second side, wherein the first side includes one or more light sensors to generate electrical signals in response to receiving light onto the first side;
a bending substrate covering the first side of the curved imaging sensor chip, wherein a stiffness of the bending substrate varies over different portions of the curved imaging sensor chip, wherein the stiffness of the bending substrate is based on a thickness of the bending substrate due to one or both of notches or grooves located on both a first surface of bending substrate that is the same side of the curved imaging sensor chip and a second surface of bending substrate that an opposite side of the curved imaging sensor chip, and wherein the thickness of the bending substrate are different at different portions of bending substrate, and wherein forces are applied to the bending substrate so as to bend the bending substrate and to resultantly impart bending forces, which are based at least in part on the stiffness of the bending substrate, on an image sensor chip to produce the curved imaging sensor chip;
a backside substrate covering the second side of the curved imaging sensor chip; and
an adhesive between the backside substrate and the curved imaging sensor chip.

11. The apparatus of claim 10, wherein the bending substrate comprises a deposited material that is bonded to the first side of the curved imaging sensor chip by deposition.

12. The apparatus of claim 10, wherein the bending substrate is bonded to the first side of the curved imaging sensor chip by an adhesive.

13. The apparatus of claim 10, wherein the curved imaging sensor chip includes corners that are rounded.

14. The apparatus of claim 10, wherein the curved imaging sensor chip has a radius of curvature that is at least approximately equal to an inverse focal length of the first side of the curved imaging sensor chip.

15. A system comprising:
a curved imaging sensor chip having a first side and an opposite second side, wherein the first side includes one or more light sensors to generate electrical signals in response to receiving light onto the first side;
a substrate covering the first side of the curved imaging sensor chip, wherein a stiffness of the substrate varies over different portions of the curved imaging sensor chip, wherein the stiffness of the substrate is based on a thickness of the substrate, wherein the thickness of the substrate are different at different portions of substrate due to one or both of notches or grooves in the bending substrate, and wherein the one or both of the notches or the grooves are distributed concentrically about a center region of the bending substrate;
a backside substrate covering the second side of the curved imaging sensor chip;
a gap between the backside substrate and the curved imaging sensor chip;
an adhesive at least partially filling the gap; and
a pressurized gas applying a force onto the substrate such that the force, which is based at least in part on the stiffness of the substrate, bends the substrate and the curved image sensor chip toward the backside substrate so that a size of the gap decreases.

16. The system of claim 15, further comprising one or more lenses to direct electromagnetic energy to the first side of the curved imaging sensor chip.

17. The system of claim 15, wherein the curved imaging sensor chip comprises germanium and the directed electromagnetic energy comprises infrared energy.

18. The system of claim 15, wherein a stiffness of the curved imaging sensor chip is greater than the stiffness of the bending substrate.

19. The method of claim 7, wherein a plurality of the notches or the grooves in the bending substrate vary in depth.

20. The method of claim 1, wherein the one or both of the notches or the grooves are located on both a first surface of bending substrate that is the same side of the imaging sensor chip and a second surface of bending substrate that an opposite side of the imaging sensor chip.

* * * * *